United States Patent
De Martin et al.

(10) Patent No.: US 7,348,901 B2
(45) Date of Patent: Mar. 25, 2008

(54) METHOD AND SYSTEM FOR DECODING VARIABLE LENGTH ENCODED SIGNALS, COMPUTER PROGRAM PRODUCT THEREFOR

(75) Inventors: Juan Carlos De Martin, Turin (IT); Antonio Servetti, Cuneo (IT); Marco Vecchietti, Turin (IT)

(73) Assignee: Telecom Italia S.p.A., Milan (IT)

( * ) Notice: Subject to any disclaimer, the term of this patent is extended or adjusted under 35 U.S.C. 154(b) by 79 days.

(21) Appl. No.: 10/561,925

(22) PCT Filed: Jun. 24, 2003

(86) PCT No.: PCT/EP03/06602

§ 371 (c)(1),
(2), (4) Date: Dec. 22, 2005

(87) PCT Pub. No.: WO2005/004495

PCT Pub. Date: Jan. 13, 2005

(65) Prior Publication Data

US 2007/0057825 A1    Mar. 15, 2007

(51) Int. Cl.
*H03M 7/40* (2006.01)
(52) U.S. Cl. .................................... 341/67; 341/60
(58) Field of Classification Search ............. 341/50–90
See application file for complete search history.

(56) References Cited

U.S. PATENT DOCUMENTS 5,253,053 A * 10/1993 Chu et al. ............... 375/240.23
5,589,829 A * 12/1996 Astle ........................... 341/67
5,646,618 A     7/1997 Walsh

OTHER PUBLICATIONS

Chung, Efficient Huffman decoding, Information Processing Letters, Elsevier, Netherlands, vol. 61, No. 2, XP002269302, ISSN: 0020-0190, pp. 97-99, (Jan. 28, 1997).
Sieminski, "Fast Decoding of the Huffman Codes", Information Processing Letters, Amsterdam, NL, vol. 26, No. 5, XP008013198, ISSN: 0020-0190, pp. 237-241, (Jan. 11, 1988).
Hashemian, "Memory Efficient and High-Speed Search Huffman Coding", IEEE Transactions on Communications, IEEE Inc., New York, US, vol. 43, No. 10, XP000535628, ISSN: 0090-6778, pp. 2576-2581, (Oct. 1, 1995).

(Continued)

*Primary Examiner*—Lam T. Mai
(74) *Attorney, Agent, or Firm*—Finnegan, Henderson, Farabow, Garrett & Dunner, L.L.P.

(57) ABSTRACT

A system adapted for use, e.g. in an MPEG audio-video decoder for decoding variable-length (e.g. Huffman) encoded codewords, each having associated a respective set of sign bits. The system operates on the basis of a signed decoding codebook including extended signed codewords. Each extended codeword includes a respective codeword in the original codebook plus the associated set of sign bits. The variable-length encoded codewords are decoded on the basis of the signed decoding codebook, whereby the codewords are decoded together with the sign bit set associated therewith. Preferably, the codewords are partitioned in "short" and "long" codewords with respect to a given threshold. The short codewords are decoded by means of a single lookup step in a first lookup table. The long words are decoded by means of a multi-step lookup process involving at least one second lookup table. The lookup tables are preferably arranged as nested lookup tables within a container table.

11 Claims, 2 Drawing Sheets

OTHER PUBLICATIONS

Bosi, et al., ISO/IEC JTC1/SC29/WG11, "Information Technology—Generic Coding of Moving Pictures and Associated Audio, Part 7: Advanced Audio Coding", pp. 1-107, 1997.

Huffman, "A Method for the Construction of Minimum-Redundancy Codes", Proceedings of the IRE, pp. 1098-1101, (1952).

Aggarwal, et al., "Efficient Huffman Decoding", Proc. ICIP, vol. 1, pp. 936-939, (2000).

Chen, et al., A memory-efficient and fast Huffman decoding algorithm, Information Processing Letters, vol. 69, No. 3, pp. 119-122, (Feb. 1999).

Moffat, et al., "On the Implementation of Minimum Redundancy Prefix Codes", IEEE Transaction on Communications, vol. 45, No. 10, pp. 1200-1207, (Oct. 1997).

Pajarola, "Fast Huffman Code Processing", University of California Irvine—Information & Computer Science Department Technical Report No. 99-43, pp. 1-6, (Oct. 1999).

Sayood, "Huffman Coding", Introduction to Data Compression—Second Edition, Morgan Kaufmann Publisher, San Francisco, California, pp. 40-76, (2000).

* cited by examiner

METHOD AND SYSTEM FOR DECODING VARIABLE LENGTH ENCODED SIGNALS, COMPUTER PROGRAM PRODUCT THEREFOR

CROSS REFERENCE TO RELATED APPLICATION

This application is a national phase application based on PCT/EP2003/006602, filed Jun. 24, 2003, the content of which is incorporated herein by reference.

FIELD OF THE INVENTION

The present invention relates to data compression, and, specifically, to computer-implemented processes and apparatus for decoding data sequences compressed using variable-length-encoding (VLE). Exemplary of such sequences are e.g. MPEG audio and video signals.

The effective use of digital multimedia signals is strictly related to the efficiency of the transport channel and storage requirements for the corresponding data. Both these objectives are substantially fulfilled by coding the signals using compression techniques to achieve higher transmission efficiency and reduced storage space. Combinations of transform coding and entropy coding techniques are known to provide relatively high code compression for high quality video and audio signals transmission.

For a general review of these topics reference can be made e.g. to ISO/IEC 13818-7, "Information Technology—Generic Coding of Moving Pictures and Associated Audio, Part 7: Advanced Audio Coding", 1997.

DESCRIPTION OF THE RELATED ART

The classic reference for VLE is the article by D. A. Huffman, "A Method for the Construction of Minimum-Redundancy Codes," Proc. IRE, pp. 1098-1101, 1952, which paved the way to the extensive use of Huffman coding in data and multimedia compression.

Essentially, VLE algorithms use a table of the frequencies of occurrence of each possible input symbol to build up an optimal way of representing each symbol as a variable-length binary string, called a codeword, with a unique prefix. In an optimum code, symbols that occur more frequently (i.e. have a higher probability of occurrence) are allotted shorter codewords in comparison with symbols that occur less frequently.

The simplest data structure used in a VLE decoding scheme is a binary code tree where each leaf represents a symbol and the path from the root to the leaf defines the variable length code for that symbol. A more detailed explanation of this concept is provided e.g. in: Khalid Sayood, "Introduction to Data Compression—SECOND EDITION," Morgan Kaufmann Publisher, San Francisco, Calif., 2000.

Decoding is performed by starting at the root node of the code tree, and by recursively traversing the tree according to the bits from the compressed input data stream, i.e. going to the left child for a 0 and going right for a 1, until a leaf is reached which indicates that a certain symbol has been fully decoded. Traditionally, tree data structures used to represent and decode VLE codes have a memory requirement of O ($2^h$) and a computational complexity of O (h), h being the height of the Huffman tree.

The binary tree becomes progressively sparse as it grows from the root, and this sparsity in the Huffman tree may cause waste of memory space. Additionally, such sparsity may also result in a lengthy search procedure for locating a symbol.

In recent literature a number of schemes have been proposed to represent VLE codes such that memory requirement and decoding complexity is reduced to O (n) and O (log n), respectively. The symbol n denotes the total number of codewords/leaves in the Huffman tree and for sparse trees n is quite small compared to $2^h$.

In the work by K.-L. Chung, "Efficient Huffman decoding", Information Processing Letters, vol. 61, no. 2, pp. 97-99, January 1997 a data structure is described requiring a memory size of only 2n−3 to represent the Huffman tree, with a resulting complexity that depends on the traversed path in the tree and that takes O (h) time.

In the work by H.-C. Chen, Y.-L. Wang, and Y.-F. Lan, "A memory-efficient and fast Huffman decoding algorithm," Information Processing Letters, vol. 69, no. 3, pp. 119-122, February 1999 the data structure is further improved to reduce the memory requirements to $[3n/2]+[(n/2)\log(n)]+1$ with a corresponding complexity of O (log n).

Fast decoding and scanning through compressed data has become more and more important with the increased availability of compressed multimedia software in the consumer market. The cost in terms of time of Huffman decoding is linear with the size of the compressed data stream, but this cost estimate does not sufficiently take into account the time used to process and decode each and every compressed data bit.

Appreciable advantages in terms of speed can be achieved if groups of bits are processed simultaneously in the place of reading and testing each single bit.

Algorithms processing e.g. 8 bits (i.e. a byte) at a time rely on additional transition tables in order to "navigate" the decoding binary tree. However, the advantages achieved in terms of speed may be offset by heavy requirements in terms of memory space dictated by the need of storing the transition tables.

To speed up decoding, works such as A. Sieminski, "Fast decoding of the Huffman codes," Information Processing Letters, vol. 26, no. 5, pp. 237-241, 1988 or R. Pajarola, "Fast Huffman Code Processing," University of California Irvine—Information & Computer Science Department Technical Report No. 99-43, October 1999 propose a decoder adapted to read and process compressed data by groups of bits using an additional transition table to navigate the VLE decoding tree. For a fixed number (k) of bits read at a time, a table with $2^k$ entries, plus the values of the symbols decoded during the transition, is needed for each node. If k is small, decoding is slow because many nodes must be traversed to complete the decoding process; otherwise, if k becomes larger, then the necessary memory space becomes too huge, i.e. O ($M*2^k$) entries with M are the number of the nodes for each possible state of the decoding process.

While being a fast process (no searching of any kind is involved), the use of a table of size $2^N$ is potentially quite wasteful in terms of memory space. For example, if there is a 1-bit codeword in the code, then half of the table entries will contain the same value.

The notionally fastest decoding algorithm known for VLE data is based on a lookup table instead of a transition graph or binary tree. While unquestionably being the fastest VLE decoding technique, lookup decoding ends up by becoming part of the "folklore" of computing: in fact, given a maximum codeword length of N bits, this approach needs a lookup table with $2^N$ entries. This may be acceptable for short code-lengths, but becomes rapidly unfeasible as the maximum codeword length increases.

Solutions to these problems have been proposed, which however lead to increasing demands in terms of processing power and time. Essentially, these solutions use smaller lookup tables whose indexes are shorter than the longest possible VLE codeword. Short codewords are decoded with a single lookup step, but the others need slower, special processing. If the VLE codebook is selected properly, then longer codewords will occur more rarely in the bitstream than shorter codewords. As a result, handling of such cases requiring the slow, special processing will occur infrequently.

In R. Hashemian, "Memory Efficient and High-Speed Search Huffman Coding," IEEE Transaction on Communications, vol. 43, no. 10, pp. 2576-2581, October 1995 an arrangement is disclosed which reduces the memory space by using k bits at a time to index a set of tables each of $2^k$ entries representing a cluster (subtree) of the Huffman tree. The cluster length is chosen to be equal to the maximum path length from the root of the cluster to a node within the cluster. A so-called super-tree (S-Tree) is constructed, where each cluster is represented by a node, and the links connecting these nodes represent the branching nodes in the Huffman tree.

In the lookup tables each entry indicates whether the codeword is a short code or a long code.

If the flag indicates that the codeword is a short code, i.e. its length is equal or shorter than k, the decoded symbol can be generated using the corresponding value and length field.

Otherwise, if the codeword is a long code, the entry records the position in the S-Tree where the description of the next lookup-table (cluster), cluster length (k) and memory address, can be found. Subsequent tables should be indexed using the next k bits of the input stream.

In comparison with the $2^{-N}$ entry approach this, k-bit at a time technique reduces the storage space at the expense of slower decoding speed.

In the paper by A. Moffat and A. Turpin, "On the Implementation of Minimum Redundancy Prefix Codes," IEEE Transaction on Communications, vol. 45, no. 10, pp. 1200-1207, October 1997 an efficient algorithm for Minimum Redundancy Prefix Coding (also known as Huffman coding) is presented wherein coding is divorced from a code tree. Specifically, a modified decoding method is disclosed that allows improved decoding speed, requiring just a few machine operations per output symbol (rather than for each decoded bit) and uses yet only a small amount of auxiliary memory. After the construction of a Huffman code, starting from the source alphabet, only the codeword length information is preserved. Codeword lengths are used to derive a "canonical" minimum redundancy code that has the numeric sequence property: all codewords of a given length are consecutive binary integers.

Such a canonical code can be decoded using a memory-compact and fast algorithm. Codewords are decoded using a lookup table whose indexes are shorter (k-bit long) than the longest possible minimum redundancy code (N-bit long). After the first lookup, which is performed in the manner suggested in the Hashemian article, in the case of a long codeword the decoded signal is generated adding to a base value the number corresponding to the additional bits to be read from the bitstream to complete the codeword (because of the numeric sequence property). Such a code, however, is no longer a "Huffman" code.

U.S. Pat. No. 5,589,829 introduces a simplified technique operating on canonical variable-length codes only where long codewords can be generated. This is done by using the code value bits corresponding to the short prefix and one or more additional bits read from the bitstream to complete the VLE codeword. Unfortunately, the Huffman tables used in video and image compression applications are standardized and most of them are not canonical, thus the decoding algorithm proposed for canonical variable-length codes is not directly applicable to this scenario.

In U.S. Pat. No. 5,646,618 an arrangement is disclosed for decoding one or more variable-length encoded signals using a single table lookup. An additional table must be used to decode longer codewords. These longer codewords need a special processing that is inefficient and slows down the decoding process. The process involves retrieving a number of bits equal to the longest possible VLE codeword, and then those bits are used as an index into a lookup table that maps to the decoded value.

Also, the paper by M. Aggarwal and A. Narayan, "Efficient Huffman Decoding," Proc. ICIP, vol. 1, pp. 936-939, 2000 proposes a solution adapted to transform the decoding tables for general Huffman codes in such a way that they possess the structure of canonical minimum redundancy codes. This transformation ensures that codewords in the modified decoding table are equivalent to the original set and does not require any modifications at the encoding end. In that way, general Huffman codes can be decoded using the simple decoding procedures applicable for canonical codes. However, a certain degree of redundancy is introduced in the decoding thus derived in that for each symbol there exist more than one corresponding codeword.

OBJECTS AND SUMMARY OF THE INVENTION

The need therefore exists for a general solution to the VLE decoding problem which requires only a small amount of calculations per codeword, that amount being independent from the number of codewords n, or the height of the Huffman tree h.

In particular, in the Advanced Audio Coding standard (MPEG-AAC), a codeword is provided with one or more sign bits in order to represent two or more symbols. In the decoding process, the interpretation of the sign bit(s) slows down the decoding process.

The object of the invention is thus to provide such an arrangement that overcomes the drawbacks of the prior art arrangements as outlined in the foregoing.

According to the invention, such an object is achieved by means of a method having the features set forth in the claims that follow. The invention also relates to a corresponding system and a computer program product loadable in the memory of a computer and including software code portions for performing the method of the invention when the product is run on a computer.

Essentially, the arrangement disclosed herein is adapted for decoding variable-length encoded signals including codewords from a codebook, the codewords having associated respective sets of sign bits. These sets typically include an empty set associated to the all-zero codeword. A signed decoding codebook is provided, typically in the form of data items in a memory. The signed decoding codebook includes extended signed codewords, each extended codeword including a respective codeword in said codebook plus the associated sign bit set. The variable-length encoded codewords are decoded by means of the signed decoding codebook, whereby the codewords are decoded together with the sign bit set associated therewith.

Preferably, a threshold value is defined for the length of said codewords, that are thus partitioned in short and long codewords, respectively. At least the short codewords are decoded by means of a lookup process against a respective lookup table whose entries are selected to correspond to the extended codewords in the signed decoding codebook. The long codewords are preferably decoded by means of a multi-step lookup process including a first lookup step to a first entry in a first lookup table to retrieve an offset value, and at least one second lookup step to at least one second entry in at least one second lookup table, the said second entry being identified by means of said offset value. Preferably the first and second lookup tables are nested lookup tables in a container table.

In a preferred embodiment, the invention is intended to define a fast algorithm, based on a multiple lookup (sub) table approach for decoding VLE codes. Heavy memory requirements are avoided by splitting the lookup table in sub-tables and fast decoding is achieved by simultaneously processing groups of bits Such an arrangement overcomes the drawbacks of the prior art discussed in the foregoing by resorting to a recursive multiple lookup sub-table approach. It can be applied to extended VLE codes where a codeword represents more than one source symbol.

The arrangement described herein is based on "nested" lookup-tables, thus demonstrating that no need exists of storing tree information in a separate table. In fact, the concept of super-tree or S-Tree discussed in the foregoing uses a higher level of indirection with respect to the arrangement disclosed herein, where the next lookup-table information is just present in each of the symbols decoding lookup table. This solution speeds up decoding while avoiding any additional request for accessing address space.

A preferred embodiment the invention is applied to fast decoding of VLE codes with signed and unsigned codebooks. Unsigned codebooks symbols are coded as absolute values and a set of one or more sign bits is appended to the codeword. This occurs only in the case of non zero values (i.e. an empty set of sign bits is appended to all-zero values).

Common decoding techniques stop fast VLE decoding in the presence of non-zero values in order to test the sign bits, which slows down the overall process.

The arrangement disclosed herein employs an extended decoding lookup table where unsigned codewords are merged with possible signs in order to avoid stopping fast decoding to test every single sign bit.

Preferably, a variable-length encoded codeword comprising up to N bits is transformed into a decoded symbol by reading k bits from a bitstream comprising the variable length encoded codeword, where k is less than N. A lookup table is accessed using the k bits from the bitstream as an index to retrieve a table entry. The table entry comprises:
- a field indicating whether the k bits contain a complete codeword that can be decoded or how many bits need to be read to complete the codeword;
- if the codeword is complete, a field with the codeword-length, otherwise a field with the offset of the next lookup table; and
- a field with the codeword-values.

If the VLE codeword is a short codeword, then the decoded symbol is generated using the codeword-value entries, where the codeword-length field indicates the length of the variable length encoded codeword.

If the VLE codeword is a long codeword, then more bits have to be read and the decoded symbol is searched recursively in the next lookup table, jumping to the referred offset, using the additional read bits as a lookup index.

The process ends when a complete codeword to be decoded is found.

This approach is based on the use of lookup tables instead of transition graphs or binary trees: N bits (where N is the maximum VLE codeword length) are read from the bitstream based on the current value of a bitstream pointer. The N bits are then used as an index to a lookup table. The lookup table has an entry for each possible N-bit value. Each table entry indicates a respective decoded symbol value and bit-length in order to update accordingly the bitstream pointer.

This approach further reduces the amount of memory needed to perform the lookup action because several smaller tables are used instead of a huge $2^N$ lookup table. A trade-off between processing time and memory waste can thus be reached by varying the number of bits read before each table lookup. If k is equal to N then a large table is used and only a single lookup is needed; conversely, if k is equal or proximate to N/2, two lookups are required but the used memory is reduced to less than $2^{(N/2)+1}$ entries.

Specifically, when the most frequent symbol of an input alphabet is zero, the symbols are usually coded as absolute values and a sign is appended to the codeword only in the case of non zero values to save storage space.

Common decoding techniques decode the VLE code and then, if non zero, test for the sign bit: 0 represents a plus sign, 1 a negative value. The arrangement disclosed herein "skips" this test that in fact stops the VLE fast decoding flow in order to test a single bit each time. Insofar as decoding is concerned, the sign bit is included in the corresponding codeword to build up a so-called signed lookup table (before starting the decoding process) that decodes both the values and the sign(s) associated therewith and generates signed codeword-values.

In comparison with prior art solutions (as described e.g. in the article by M. Aggarwal et al. cited in the foregoing), the arrangement disclosed herein is applied in its preferred embodiment to non-canonical Huffman codes, relying on the multiple table lookup approach already presented in the Hashemian paper referred to in the foregoing. Encoded symbols can then be decoded with two or more cascading lookup tables and the symbol translations are duplicated only for those entries that start with the same symbol prefix.

The suggested inclusion of the sign bit when decoding unsigned extended VLE codes, where each codeword represents more than one source symbol, avoids having to stop decoding when a sign bit is to be tested for non zero-valued symbols.

The invention is particularly adapted to be applied to an extended VLE code as used e.g. in the MPEG Advance Audio Coding (AAC) Standard where, instead of generating a codeword for each symbol, codewords are generated representing two or four symbols.

BRIEF DESCRIPTION OF THE DRAWINGS

The invention will now be described, by way of example only, with reference to the annexed figures of drawing, wherein.

DETAILED DESCRIPTION OF PREFERRED EMBODIMENTS OF THE INVENTION

The arrangement disclosed herein is essentially in the form of a decoder 10 adapted to receive an input signal IS comprised of a variable-length-encoded (e.g. Huffman) digital data stream. As a result of the decoding process carried out therein, the decoder 10 produces an output, decoded data stream OS.

The decoder 10 may be included as a building block in a more complex processing system (not shown) such as a decoder for e.g. MPEG audio and video signals: the general layout and principles of operation of such a audio/video decoder are well known in the art, thus making it unnecessary to provide a more detailed description herein.

Similarly known, and thus not requiring to be described here in detail, are the criteria adopted for producing the encoded input signal IS. Essentially, VLE algorithms use a table of the frequencies of occurrence of each possible input symbol to build up an optimal way of representing each symbol as a variable-length binary string, called a codeword, with a unique prefix. In an optimum code, symbols that occur more frequently (i.e. have a higher probability of occurrence) are allotted shorter codewords in comparison with symbols that occur less frequently.

The input signal IS may be generated on the basis of Huffman codebooks designed for multimedia contents where a codeword represents more than one signed source symbol.

Since the most frequent symbol of the alphabet is zero, to save storage space, media contents usually presents a sequence of codewords followed by sign bits only if the symbols coded are different from zero.

Essentially, the decoder 10 includes a processing unit 12 that generates an output decoded data stream OS as a result of interaction with memory block 14. For reasons to become clearer in the following, the memory block 14 essentially acts as a container CNR for an assembly of nested lookup tables LUT1, and LUT2.

Those of skill in the art will appreciate that the decoder, and specifically the processing unit 12, may be implemented both in the form of a dedicated processor or as a general purpose computer programmed by means of a suitable computer program product loaded in the computer memory. Also, the decoder 10 may represent either a stand-alone assembly or a portion of a larger unit such as the audio/video MPEG decoder referred to in the foregoing.

Implementing the decoder 10 in any of the forms considered in the foregoing represents a task within the common ability of the person skilled in the art having read the detailed description provided herein.

Figure 1:
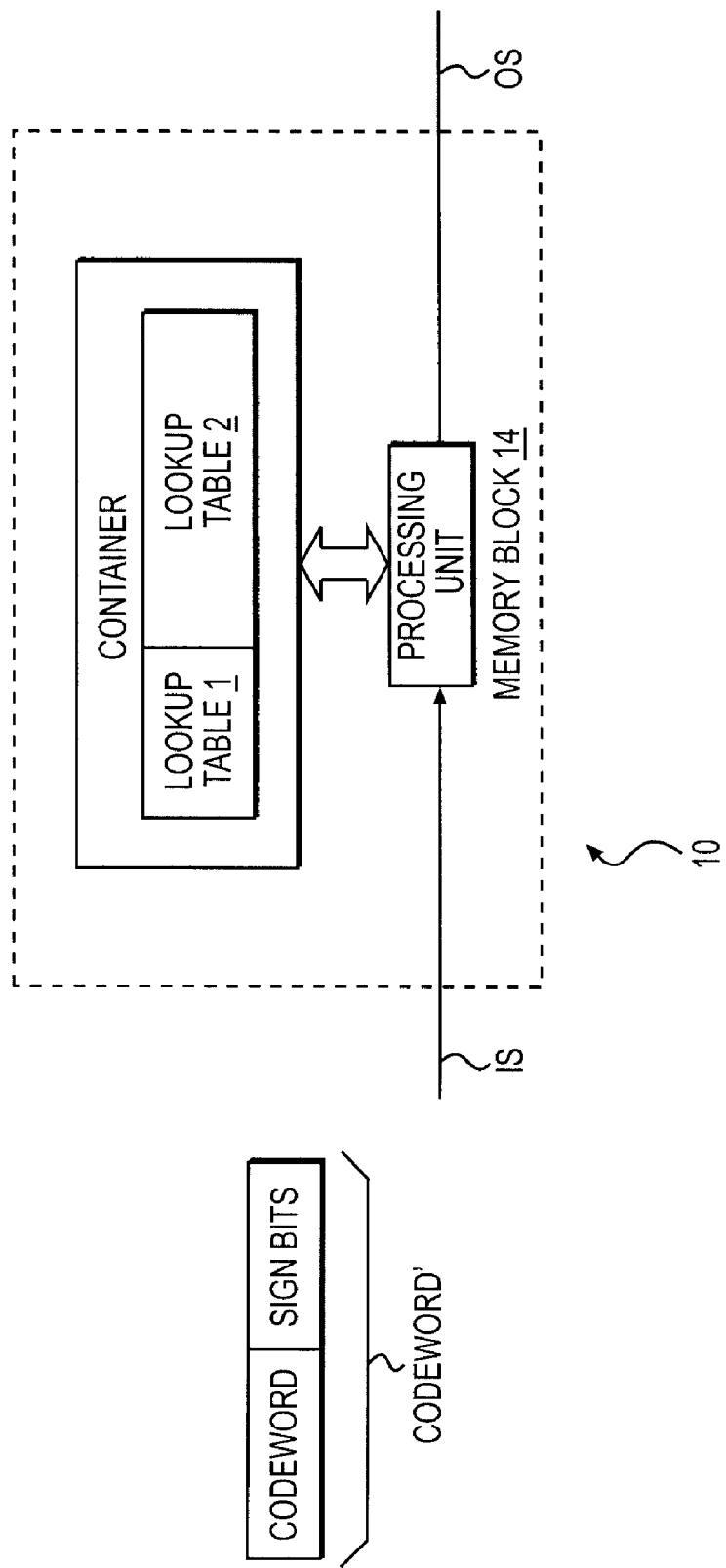
FIG. 1 is a general block diagram of a decoder for decoding variable-length-encoded (VLE) data.

A basic purpose of the decoder 10 described herein is to avoid having to stop the decoding process to test every sign bit, after decoding the codewords. In fact, as shown in FIG. 1, the sign bits can be regarded as an additional field SB appended at the end of the corresponding codeword CW.

Starting from existing codebooks, it is possible to generate new codebooks with extended codewords (including the sign bits) that maintain unchanged the same probability distribution of the original codewords.

Assume N is the number of bits in the largest (i.e. longest) codeword, without signed extension. If the cod ebook is properly generated, then shorter codewords are more frequent than longer codewords.

A value k may then be considered as an index adapted to distinguish "short" codewords from "long" codewords. Experiments performed by the Applicant show that an advantageous (yet not mandatory) choice for k is in the vicinity of N/2, e.g. N/2 plus the maximum number of sign bits added to the codewords. A lookup table may thus be accessed using each k bits from the input bit stream IS as an index to retrieve a table entry.

Then every codeword that has a length less than or equal to k (i.e. any "short" codeword) can be decoded in one step by using a first lookup table LUT1 in the "container" CNR. Long codewords, i.e. those having lengths greater than k bits, can be analyzed using n-k bits (where n is less than or equal to N) as an index in at least one further lookup table LUT2 in the container CNR.

The lookup tables LUT1, LUT2 being arranged in one single container table, hierarchically nested, avoids memory space being wasted.

The first entries of the container table coincide with the entries of the first lookup table LUT1, thus making it possible to treat the container table CNR as a simple lookup table. The other lookup table(s)—designated LUT2 as a whole—are reachable by means of an offset filed in the "parent" table.

Each entry of the lookup table may be configured to present the following field arrangement:
  number of bits to be read to complete the codeword; if the entry identifies a short codeword this field is equal to zero;
  codeword length if short codeword or long codeword whose decoding has been completed; otherwise the offset of the next lookup table; and
  the decoded symbols, if short codeword or long codeword whose decoding has been completed i.e. the completely decoded symbols.

The lookup table offset field defines the number of entry lines from the current position the decoding process needs to "jump" in order to complete the analysis of the current long codewords.

To explain in greater detail this decoding concept the Huffman table shown in Table 1 can be taken as an example where every encoded codeword identifies two signed symbols (x, y). Specifically, in the table the field "length" indicates the number of bits in the adjacent codeword.

TABLE 1

| X | y | Length | Codeword |
|---|---|--------|----------|
| 0 | 0 | 1 | 1 |
| 0 | 1 | 3 | 010 |
| 0 | 2 | 6 | 000001 |
| 1 | 0 | 3 | 011 |
| 1 | 1 | 3 | 001 |
| 1 | 2 | 5 | 00001 |
| 2 | 0 | 5 | 00011 |
| 2 | 1 | 5 | 00010 |
| 2 | 2 | 6 | 000000 |

In order to avoid stopping the decoding flow to test the coded symbol sign, the decoder 10 described herein operates on the basis of a new, modified Huffman table created by appending at the end of the corresponding codeword the necessary number of bit sign. Such a modified, signed Huffman table is shown in Table 2, where the field "length" again designates the number of bits in the adjacent codeword. In this case, however, the codewords are extended, signed codewords (designated CW' in FIG. 1) that also include the sign bits SB appended thereto.

No such bits (i.e an empty set of such bits) are obviously provided for the codeword "1" that represents the sign-less couple of values "0, 0".

TABLE 2

| x | y | Length | Codeword |
|---|---|--------|----------|
| 0 | 0 | 1 | 1 |
| 0 | 1 | 3 + 1 | $010s_y$ |
| 0 | 2 | 6 + 1 | $000001s_y$ |
| 1 | 0 | 3 + 1 | $011s_x$ |
| 1 | 1 | 3 + 1 | $001s_x s_y$ |
| 1 | 2 | 5 + 2 | $00001s_x s_y$ |
| 2 | 0 | 5 + 1 | $00011s_x$ |
| 2 | 1 | 5 + 2 | $00010s_x s_y$ |
| 2 | 2 | 6 + 2 | $000000s_x s_y$ |

The largest codeword of the original codebook includes 6 bits; therefore the value k used as index of the first lookup table can be equal to 5(N/2+2, where 2 is the maximum number of sign bit added to the codewords).

In order to deal with the extended codebook shown in Table 2 the container table CNR includes two nested lookup tables LUT 1, LUT2 as shown in Table 3.

In the example considered, the container table CNR has 50 (fifty) entries, and four of the most frequent symbols (i.e. entries with index from 4 to 31, that in fact constitute the first lookup table LUT1) are quickly decoded in one step only—including the sign bits(s) associated therewith.

In this example, symbols that have an original codeword length equal to 3, can be decoded in only one step. Decoding of these shorter codewords is thus performed as a "straight-through" process without any breaks between decoding the symbols and interpreting the sign bits.

TABLE 3

| Index | Codeword | Further bit | Length/ Offset | Symbol x | Y |
|-------|----------|-------------|----------------|----------|---|
| 0 | 00000 | 3 | 31 | — | — |
| 1 | 00001 | 2 | 39 | — | — |
| 2 | 00010 | 2 | 42 | — | — |
| 3 | 00011 | 1 | 45 | — | — |
| 4 | 00100 | 0 | 5 | 1 | 1 |
| 5 | 00101 | 0 | 5 | 1 | -1 |
| 6 | 00110 | 0 | 5 | -1 | 1 |
| 7 | 00111 | 0 | 5 | -1 | -1 |
| 8 | 01000 | 0 | 4 | 0 | 1 |
| 9 | 01001 | 0 | 4 | 0 | 1 |
| 10 | 01010 | 0 | 4 | 0 | -1 |
| 11 | 01011 | 0 | 4 | 0 | -1 |
| 12 | 01100 | 0 | 4 | 1 | 0 |
| 13 | 01101 | 0 | 4 | 1 | 0 |
| 14 | 01110 | 0 | 4 | -1 | 0 |
| 15 | 01111 | 0 | 4 | -1 | 0 |
| 16 | 10000 | 0 | 1 | 0 | 0 |
| ... | | | | | |
| 31 | 11111 | 0 | 1 | 0 | 0 |
| 32 | 000 | 0 | 8 | 2 | 2 |
| 33 | 001 | 0 | 8 | 2 | -2 |
| 34 | 010 | 0 | 8 | -2 | 2 |
| 35 | 011 | 0 | 8 | -2 | -2 |
| 36 | 100 | 0 | 7 | 0 | 2 |
| 37 | 101 | 0 | 7 | 0 | 2 |
| 38 | 110 | 0 | 7 | 0 | -2 |
| 39 | 111 | 0 | 7 | 0 | -2 |
| 40 | 00 | 0 | 7 | 1 | 2 |
| 41 | 01 | 0 | 7 | 1 | -2 |
| 42 | 10 | 0 | 7 | -1 | 2 |
| 43 | 11 | 0 | 7 | -1 | -2 |
| 44 | 00 | 0 | 7 | 2 | 1 |
| 45 | 01 | 0 | 7 | 2 | -1 |
| 46 | 10 | 0 | 7 | -2 | 1 |
| 47 | 11 | 0 | 7 | -2 | -1 |

TABLE 3-continued

| Index | Codeword | Further bit | Length/ Offset | Symbol x | Y |
|-------|----------|-------------|----------------|----------|---|
| 48 | 0 | 0 | 6 | 2 | 0 |
| 49 | 1 | 0 | 6 | -2 | 0 |

Of course, the same extended codebook could be used to decode directly all codewords, building only one lookup table with $2^N$ entries. This would however lead to heavy memory requirements and, generally, an inefficient memory usage.

As an alternative to such a basic lookup decoding technique, the decoding process proposed in the article by Hashemian repeatedly referred to in the foregoing could be resorted to. This would lead to generating a super-tree with two clusters, that use two lookup tables each of $2^k$ entries, with k—in the present example—equal to 5. Such an arrangement would employ 64 (sixty-four) entries.

Figure 2:
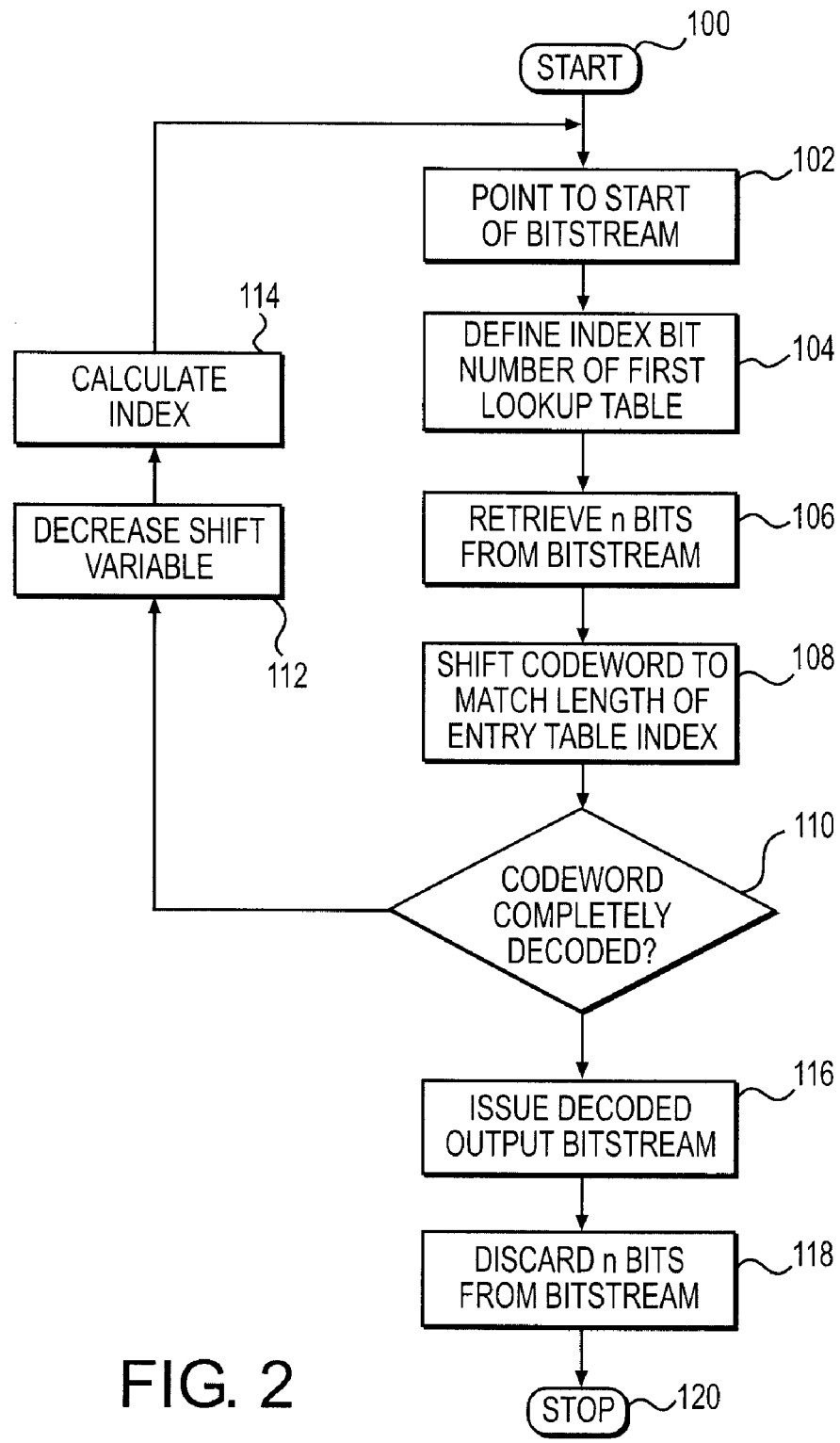
FIG. 2 is a flowchart of a process adapted to be carried out in the decoder of FIG. 1.

With the decoder arrangement described herein, based on the container table CNR, only 50 (fifty) entries are required for decoding the same codebook. This is a very satisfactory result and, additionally, is adapted to be implemented easily from the computational viewpoint. This occurs in the processing unit 12 as now described in connection with the flowchart of FIG. 2.

After a "start" step 100, in a step 102 a pointer is generated pointing to the start of the bitstream IS to be decoded. Reference is then made to the container table CNR of nested lookup tables LUT1, LUT2 with three fields for each entry (number of bits, length, value) as further described below.

In a step 104 a constant bitEntry is used to define the index bit number of the first lookup table LUT1 in the container table CNR.

In a step 106 a function GetBit retrieves n bits from the bitstream IS. Specifically, the function GetBit reads n bits from the input bitstream IS, where n coincides with the number of bits in the longest codeword in the specified codebook.

In a step 108 the codeword obtained is shifted to match the right length of the entry table index and the iteration loop continues until the codeword is completely decoded.

Specifically in a step 110 a check is made as to whether the codeword is completely decoded, which yields a positive result in the case of all "short" words in the codebook.

If the outcome of the check in the step 110 is negative, which is indicative of a "long" codeword having to be decoded, the system evolves back to step 102. At each iteration of the loop, in a step 112 the shift variable is decreased accordingly to the remaining number of bits that are still to be read, and the index is calculated in a step 114 by adding to the table offset field the shifted part of codeword.

If the codeword is short or the (long) codeword is finally completely decoded, the step 110 yields a positive result and the computed index identifies the value of the corresponding codeword that has been read from the bitstream.

This is issued in a step 116 as a corresponding decoded output bitstream OS, and in a step 118 a function FlushBit discards n bits from the bitstream, changing the current position of the read pointer to the bitstream.

Reference 120 designates a final step in the decoding process.

In the following a pseudo-code implementation of the process just described is reproduced.

```
While (B < pEndBitStream) {
    HuffmanDecode( )
}
HuffmanDecode ( )
{
    codeword = GetBit(B, n)
    shift = n – bitEntry
    index = codeword >> shift
    while (Table[index].nbit) {
        shift –= Table[index].nbit
        index += Table[index].len + ((codeword >> shift) &
            ((1 << Table[index].nbit) – 1))
    }
    symbol = Table[index].value
    FlushBit(B, Table[index].len)
}
```

The simplicity of the arrangement just described can be illustrated with an example.

Consider the input bitstream IS 0101000100101100, which corresponds to the three couples of symbols (0; −1), (2; −1) and (1; 0).

The three basic process steps described in the foregoing and the values of the intermediate variables are shown in Table 4.

TABLE 4

| step/iter. | IS | shift | Index | Nbit | Len | Codeword | x | y |
|---|---|---|---|---|---|---|---|---|
| 1/1 | 01010001 | 3 | 10 | 0 | 4 | 0101 | 0 | −1 |
| 2/1 | 00010010 | 3 | 2 | 2 | 42 | — | — | — |
| 2/2 | 010 | 1 | 45 | 0 | 7 | 0001001 | 2 | −1 |
| 3/1 | 01100xxx | 3 | 12 | 0 | 4 | 0110 | 1 | 0 |

It will be appreciated that the computations required are in fact four memory accesses, three iterations of the bitstream operations (GetBit, FlushBit), and at most two shift operations per codeword.

Of course, without prejudice to the underlying principles of the invention, the details and embodiments may vary, even significantly, with respect to what has been described by way of example only, without departing from the scope of the invention as defined in the claims that follow.

The invention claimed is:

1. A method of decoding variable-length encoded signals including codewords from a codebook, said codewords having associated respective sets of sign bits, the method comprising:
   providing a signed decoding codebook including extended signed codewords, each extended codeword including a respective codeword in said codebook plus the associated sign bit set;
   decoding said variable-length encoded codewords by means of said signed decoding codebook, whereby said codewords are decoded together with the sign bit set associated therewith;
   defining a threshold value for the length of said codewords, wherein said threshold value partitions said codewords in short and long codewords, respectively; and
   decoding at least said short codewords by means of a lookup process against a respective lookup table whose entries are selected to correspond to the extended codewords in said signed decoding codebook.

2. The method of claim 1, wherein said codewords in said codebook have a maximum length, and said threshold value is selected in the vicinity of half said maximum length.

3. The method of claim 1, comprising the step of decoding said long codewords by means of a multi-step lookup process, said multi-step lookup process comprising:
   a first lookup step to a first entry in a first lookup table to retrieve an offset value, and
   at least one second lookup step to at least one second entry in at least one second lookup table, said second entry being identified by means of said offset value.

4. The method of claim 3, comprising the step of arranging said first lookup table and said at least one second lookup table as nested lookup tables in a container table.

5. The method of claim 3, wherein said first entry to said first lookup table comprises:
   a first field, identifying the codeword to be decoded as a short codeword or a long codeword, respectively;
   a second field comprising:
      the length of said codeword if said codeword is either of a short codeword or a long codeword completely decoded, or
      said offset value if said codeword is a long codeword still to be partly decoded; and
   a third field including the completely decoded symbols.

6. A system for decoding variable-length encoded signals including codewords from a codebook, said codewords having associated respective sets of sign bits, comprising:
   at least one memory having stored therein data items defining a signed decoding codebook including extended signed codewords, each extended codeword including a respective codeword in said codebook plus the associated sign bit set; and
   a processing unit adapted to receive variable-length encoded signals and to interact with said at least one memory to decode said variable-length encoded codewords by means of said signed decoding codebook stored in said at least one memory, whereby said codewords are decoded together with the sign bit set associated therewith, wherein
   said memory comprises stored data items defining a respective lookup table whose entries are selected to correspond to the extended codewords in said signed decoding codebook; and
   said processing unit is configured for:
   defining a threshold value for the length of said codewords, wherein said threshold value partitions said codewords in short and long codewords, respectively, and
   decoding at least said short codewords by means of a lookup process against said respective lookup table.

7. The system of claim 6, wherein said codewords in said codebook have a maximum length and said threshold value is in the vicinity of half said maximum length.

8. The system of claim 6, wherein
   said memory comprises stored data items defining:
   a first lookup table including a set of entries leading to respective offset values, and
   at least one second lookup table including second entries identified by said respective offset values; and
   said processing unit is configured for decoding said long codewords by means of a multi-step lookup process, said multi-step lookup process comprising:
   a first lookup step to a first entry in said first lookup table to retrieve an offset value, and at least a second lookup step to at least a second entry in said at least one second lookup table, said second entry being identified by means of said offset value.

9. The system of claim 8, wherein said memory is arranged as a container table including said first lookup table and said at least one second lookup table as nested lookup tables.

10. The system of claim 8, wherein said first entry to said first lookup table comprises:
   a first field, identifying the codeword to be decoded as a short codeword or a long codeword, respectively;
   a second field comprising:
      the length of said codeword if said codeword is either of a short codeword or a long codeword completely decoded, or
      said offset value if said codeword is a long codeword still to be partly decoded; and
   a third field including the completely decoded symbols.

11. A computer-readable medium storing instructions for execution by a processor, said instructions capable of being loadable in a memory of at least one computer and including software code portions for performing a method of decoding variable-length encoded signals including codewords from a codebook, said codewords having associated respective sets of sign bits, the method comprising:
   providing a signed decoding codebook including extended signed codewords, each extended codeword including a respective codeword in said codebook plus the associated sign bit set;
   decoding said variable-length encoded codewords by means of said signed decoding codebook, whereby said codewords are decoded together with the sign bit set associated therewith;
   defining a threshold value for the length of said codewords, wherein said threshold value partitions said codewords in short and long codewords, respectively; and
   decoding at least said short codewords by means of a lookup process against a respective lookup table whose entries are selected to correspond to the extended codewords in said signed decoding codebook.

* * * * *